US010756699B2

(12) United States Patent
Abe

(10) Patent No.: US 10,756,699 B2
(45) Date of Patent: Aug. 25, 2020

(54) PEDESTAL FOR VIBRATION ELEMENT, RESONATOR, AND OSCILLATOR

(71) Applicant: NIHON DEMPA KOGYO CO., LTD., Tokyo (JP)

(72) Inventor: Tomonori Abe, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/508,296

(22) Filed: Jul. 10, 2019

(65) Prior Publication Data
US 2020/0021268 A1 Jan. 16, 2020

(30) Foreign Application Priority Data
Jul. 13, 2018 (JP) ................. 2018-133010

(51) Int. Cl.
*H03H 9/10* (2006.01)
*H03H 9/05* (2006.01)
*H03H 9/19* (2006.01)
*H03B 5/32* (2006.01)
*H03B 5/04* (2006.01)

(52) U.S. Cl.
CPC ................ *H03H 9/10* (2013.01); *H03B 5/32* (2013.01); *H03H 9/0552* (2013.01); *H03H 9/19* (2013.01); *H03B 5/04* (2013.01); *H03B 2200/009* (2013.01)

(58) Field of Classification Search
CPC .......... H03H 9/10; H03H 9/0552; H03H 9/19; H03H 9/09; H03H 9/1014; H03H 9/02086; H03B 5/32; H03B 5/04; H03B 2200/009
See application file for complete search history.

(56) References Cited

U.S. PATENT DOCUMENTS

2005/0285691 A1* 12/2005 Hosokawa ........... H03H 9/0514
331/158
2009/0096326 A1* 4/2009 Onishi ................... H04R 17/00
310/334

FOREIGN PATENT DOCUMENTS

JP 3017750 3/2000
JP 4715252 7/2011
JP 2013098678 5/2013

* cited by examiner

Primary Examiner — Jeffrey M Shin
(74) Attorney, Agent, or Firm — JCIPRNET

(57) ABSTRACT

A pedestal for a vibration element includes a main body that includes two connection portions, two clearance portions, a mounting portion, and arm portions. The two connection portions are formed along long sides of the main body and contact the base plate. The two clearance portions are formed on insides of the main body with respect to the connection portions and formed along the long sides. The mounting portion is located between the two clearance portions. The vibration element is mounted to the mounting portion. The arm portions are formed on four corners of the main body and connect the mounting portion to the connection portions. A metal pattern is connected to an electrode formed on the vibration element. The metal pattern is formed to connect the mounting portion, the arm portions, and the connection portions.

11 Claims, 6 Drawing Sheets

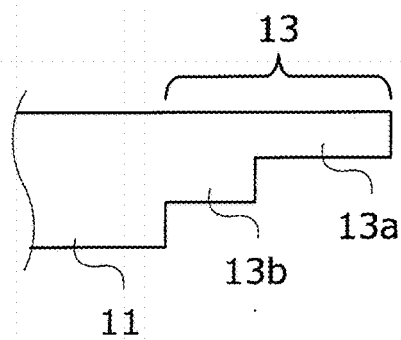
FIG. 10A1
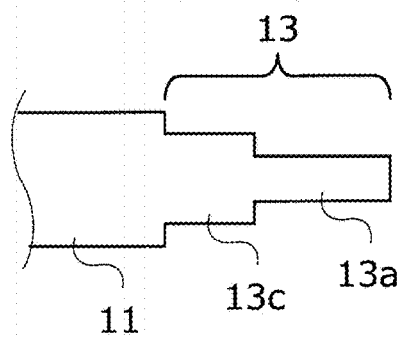
FIG. 10B1
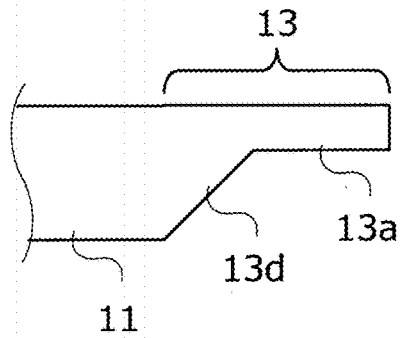
FIG. 10C1
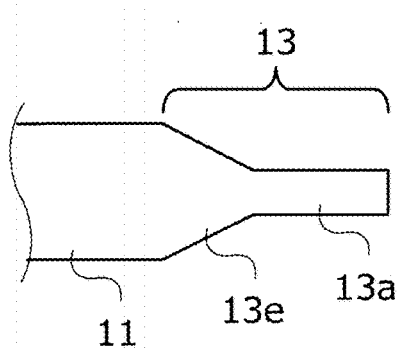
FIG. 10D1
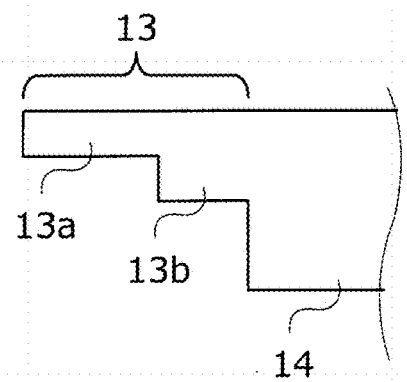
FIG. 10A2
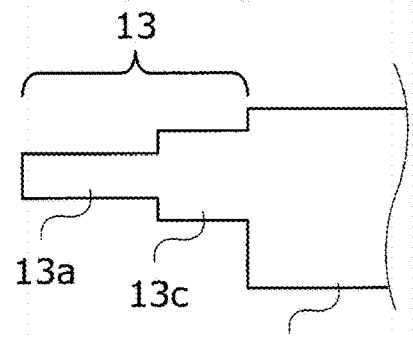
FIG. 10B2
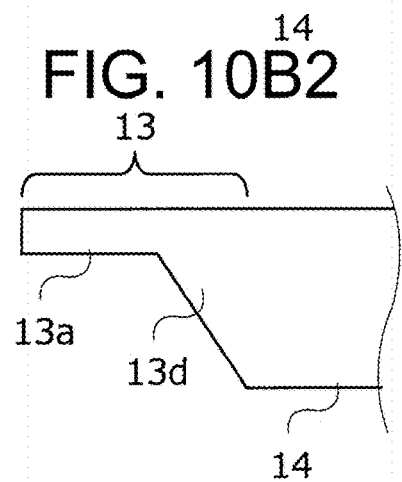
FIG. 10C2
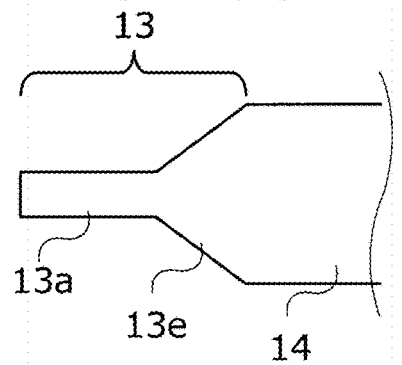
FIG. 10D2

PEDESTAL FOR VIBRATION ELEMENT, RESONATOR, AND OSCILLATOR

CROSS-REFERENCE TO RELATED APPLICATIONS

This application claims the priority benefit of Japanese Patent Application No. 2018-133010, filed on Jul. 13, 2018. The entirety of the above-mentioned patent application is hereby incorporated by reference herein and made a part of this specification.

TECHNICAL FIELD

This disclosure relates to a pedestal to which a vibration element is mounted, especially, a pedestal for vibration element that improves a resistance against a vibration from outside to ensure an excellent phase noise characteristic, a resonator, and an oscillator.

DESCRIPTION OF THE RELATED ART

Conventional Technique

In a conventional crystal unit, a configuration where a pedestal (crystal pedestal) mainly formed of crystal is employed is known as a configuration that reduces an influence to a crystal element by a package and from an outside of the package.

There is a crystal controlled oscillator including a package configured to have depressed portions on a front and back providing an H structure. The package has the front side to which a crystal element and a crystal pedestal are mounted, and the back surface to which an IC (Integrated Circuit) of an oscillator circuit is mounted.

There is a Temperature Compensated Crystal Oscillator (TCXO) that includes a temperature compensation circuit disposed on a front surface or a back surface of a package.

Related Art

Related prior arts are disclosed in Japanese Patent No. 3017750 "CRYSTAL UNIT", Japanese Patent No. 4715252 "PIEZOELECTRIC RESONATOR", and Japanese Unexamined Patent Application Publication No. 2013-098678 "CRYSTAL UNIT".

Japanese Patent No. 3017750 discloses a crystal unit that includes a holding blank having a depressed portion formed at a position for mounting a vibration crystal element. The crystal unit reliably excites the vibration crystal element in a clearance formed by the depressed portion and reduces a stress due to a heat in a longitudinal direction of an excitation crystal element.

Japanese Patent No. 4715252 discloses a piezoelectric resonator that includes a spring portion including a clearance to reduce the thermal expansion influence to a base plate.

Japanese Unexamined Patent Application Publication No. 2013-098678 discloses a crystal unit configured to prevent deformation of a crystal element in association with a temperature change and ensure the excellent frequency/temperature characteristics.

However, the conventional crystal pedestal of the crystal unit or the crystal controlled oscillator has a problem that a vibration from outside influences the crystal element and the vibration deteriorates a phase noise characteristic.

Japanese Patent No. 3017750, Japanese Patent No. 4715252, and Japanese Unexamined Patent Application Publication No. 2013-098678 do not disclose the following configuration. An electrode part contacting a base plate made of, for example, ceramic is formed to be thick while a mounting portion to which a crystal element is mounted is formed to be thin to dispose the mounting portion apart above the base plate. A connecting part of the electrode part and the mounting portion is formed to be further thinner to improve the vibration resistance characteristic (vibration resistance) against a vibration from outside.

A need thus exists for a pedestal for vibration element, a resonator, and an oscillator which are not susceptible to the drawback mentioned above.

SUMMARY

According to an aspect of this disclosure, there is provided a pedestal for a vibration element. The vibration element is mounted to the pedestal. The pedestal is installed to a base plate of a package. The pedestal includes a main body that includes two connection portions, two clearance portions, a mounting portion, and arm portions. The two connection portions are formed along long sides of the main body and contact the base plate. The two clearance portions are formed on insides of the main body with respect to the connection portions and formed along the long sides. The mounting portion is located between the two clearance portions. The vibration element is mounted to the mounting portion. The arm portions are formed on four corners of the main body and connect the mounting portion to the connection portions. A metal pattern is connected to an electrode formed on the vibration element. The metal pattern is formed to connect the mounting portion, the arm portions, and the connection portions.

BRIEF DESCRIPTION OF THE DRAWINGS

The foregoing and additional features and characteristics of this disclosure will become more apparent from the following detailed description considered with reference to the accompanying drawings, wherein:

FIG. 10A1 to FIG. 10D2 are schematic diagrams illustrating a shape of an arm portion.

DESCRIPTION OF EMBODIMENTS

The following describes an embodiment of the disclosure with reference to the drawings.

Outline of Embodiment

A pedestal (this pedestal) for a vibration element according to the embodiment of the disclosure includes: connection portions, clearance portions, a mounting portion for the vibration element, and arm portions. The connection portion is connected to a base plate of a package along a long side. The clearance portion is formed on an inside of the connection portion along the long side. The mounting portion for the vibration element is located between the clearance portions. The arm portion connects the mounting portion to the connection portion. The pedestal is formed such that a metal pattern connected to electrodes formed on the vibration element connects the mounting portion, the arm portion, and the connection portion. Even when a vibration is transmitted to the connection portion from outside, the arm portion can absorb the vibration to prevent the vibration transmission to the mounting portion, thus this pedestal ensures the excellent phase noise characteristic and the improved impact resistance.

A resonator (the present resonator) according to the embodiment of the disclosure includes: the vibration element mounted to the pedestal, and this pedestal is installed to the package having a depressed portion.

An oscillator (the present oscillator) according to the embodiment of the disclosure includes: an oscillator circuit, mounted to a depressed portion on a back surface of the package of this resonator.

Figure 1:
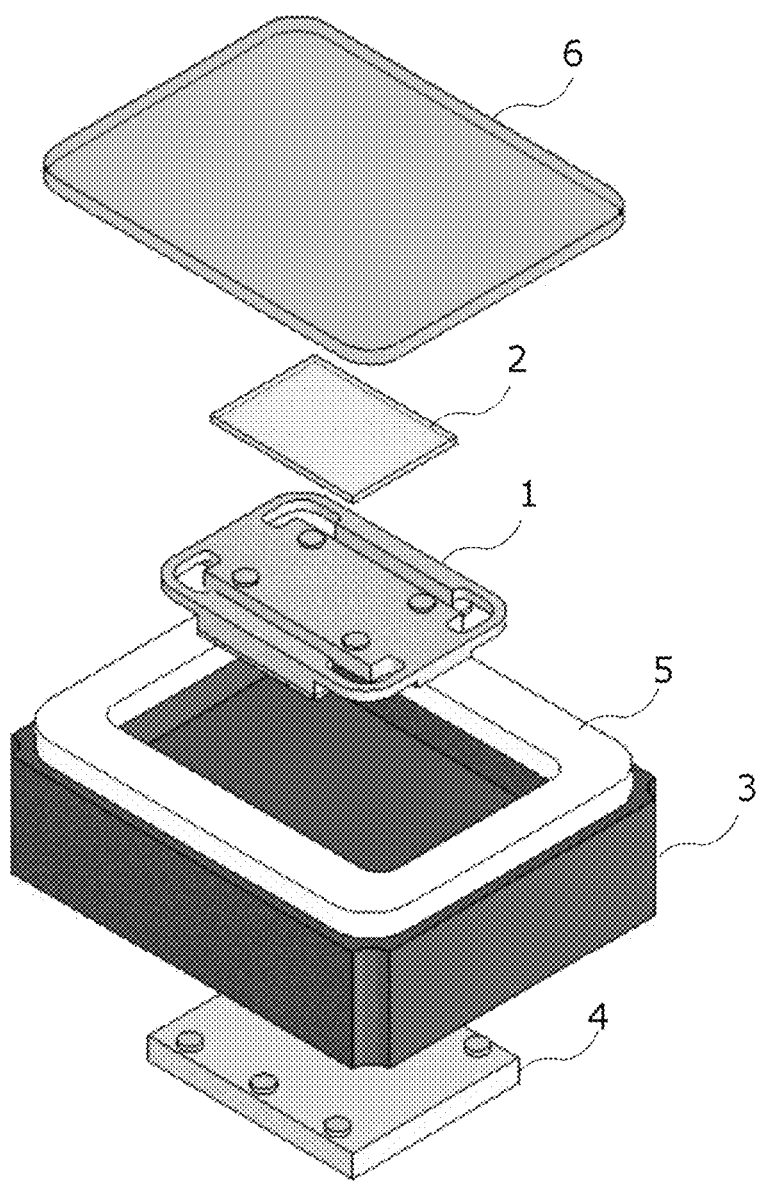
FIG. 1 is a schematic diagram illustrating this oscillator.

The Present Oscillator: FIG. 1

The following describes the oscillator with reference to FIG. 1. FIG. 1 is a schematic diagram illustrating the oscillator. As illustrated in FIG. 1, the oscillator basically includes: a crystal element 2, a pedestal 1 to which the crystal element 2 is mounted, a package 3, an oscillator circuit (IC) 4, a seam ring 5, and a lid 6 as a cover. The package 3 has a front surface having a depressed portion that houses the pedestal 1, and the depressed portion has a bottom surface (base plate) to which the pedestal 1 is mounted. The oscillator circuit (IC) 4 is mounted to a depressed portion on a back surface of the package 3. The seam ring 5 is formed on a peripheral area of the front surface of the package 3.

Respective Components of this Oscillator

The following specifically describes respective components of the oscillator.

The pedestal 1 is formed of an insulating material, for example, a resin such as heat-resistant plastic, glass, and metal having a surface coated with an insulating film.

The pedestal 1 may be formed of a crystal (an AT-cut crystal similar to the crystal element 2 or a Z-cut plate crystal) similar to the crystal element 2. In this case, the pedestal 1 and the crystal element 2 have approximately equal coefficients of thermal expansion, and a stress due to a temperature change is not generated. The pedestal 1 will be described in detail later.

The crystal element 2 is secured and mounted to the pedestal 1 with a conductive adhesive.

The crystal element 2 has a front surface and a back surface on which excitation electrodes are formed, and the excitation electrodes are connected to electrode patterns of the pedestal 1 with a conductive adhesive.

As the vibration element mounted to the pedestal 1, while a crystal resonator made of the AT-cut crystal element 2 is employed, any piezoelectric resonator including a Surface Acoustic Wave (SAW) resonator and an oscillation element (vibration element) of a resonator such as a Micro Electro Mechanical Systems (MEMS) resonator may be employed.

The package 3 is formed of, for example, a ceramic and has depressed portions formed on both the front surface and the back surface, providing an H-shaped cross-sectional surface. The package 3 houses the pedestal 1 and the crystal element 2 in the depressed portion on the front surface. The pedestal 1 is mounted to the bottom surface (base plate) of this depressed portion, and the oscillator circuit 4 is housed to be mounted to the depressed portion on the back surface.

Mounting the pedestal 1 and the oscillator circuit 4 to the package 3 is secured with, for example, solder.

The oscillator circuit (IC) 4 is housed in the depressed portion on the back surface of the package 3, and is mounted to the bottom surface (base plate) of this depressed portion. A temperature compensation circuit other than this IC 4 may be disposed on the front base plate or the back base plate of the package 3. Installation of the temperature compensation circuit provides a temperature compensated crystal oscillator (TCXO).

The seam ring 5 is formed of a silver (Ag) brazing and the like on the peripheral area of the front surface of the package 3 to perform a seam sealing.

The lid 6 is a cover formed of, for example, a material in which a kovar is plated with nickel, and is formed so as to adhere to the seam ring 5.

The Pedestal in FIG. 2 to FIG. 7

Figure 2:
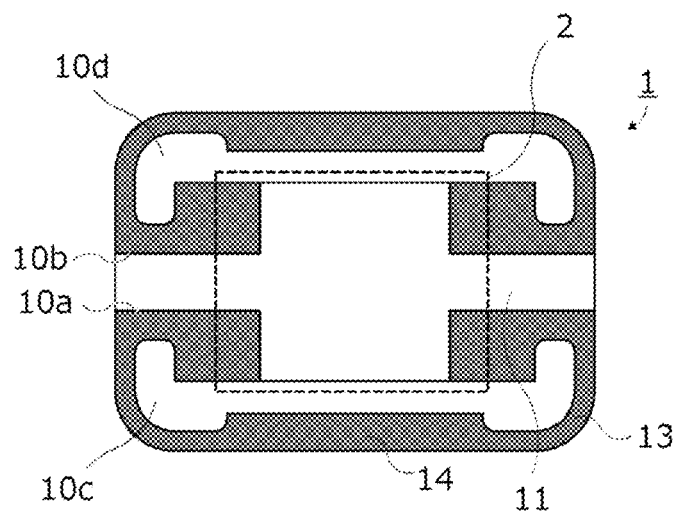
FIG. 2 is an explanatory drawing illustrating a front surface of this pedestal.
Figure 3:
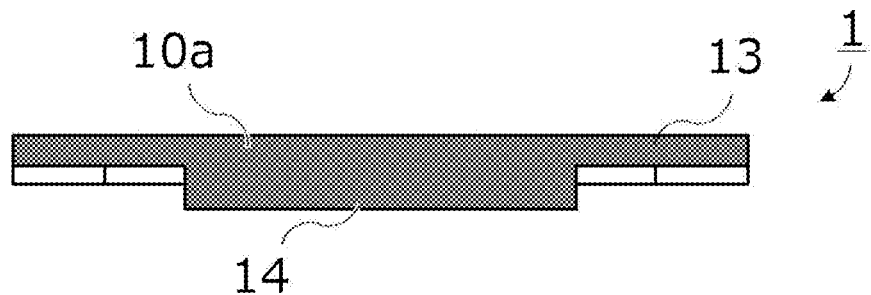
FIG. 3 is an explanatory drawing illustrating a long side surface of this pedestal.
Figure 4:
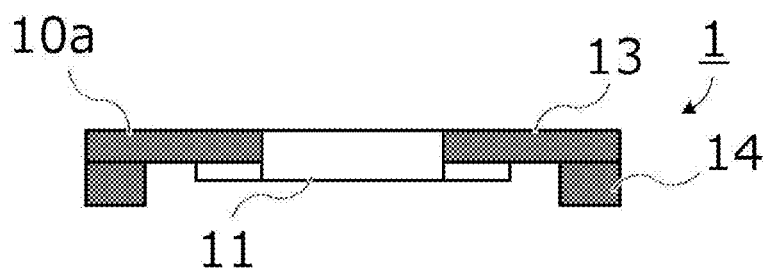
FIG. 4 is an explanatory drawing illustrating a short side surface of this pedestal.
Figure 5:
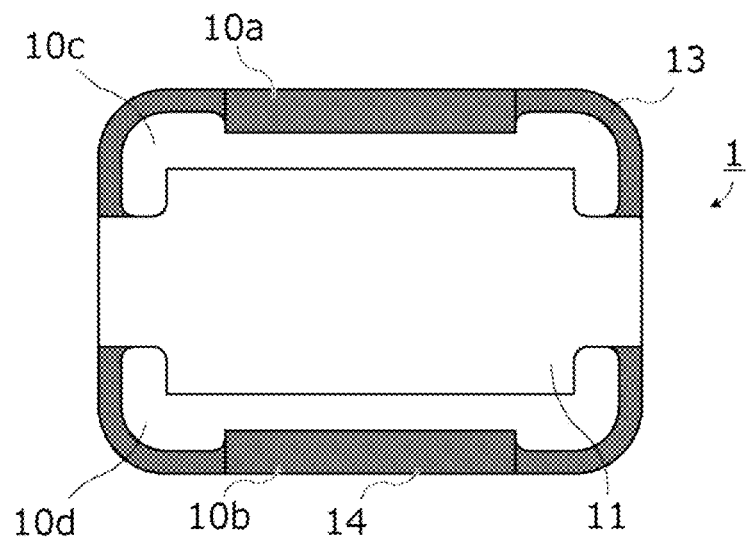
FIG. 5 is an explanatory drawing illustrating a back surface of this pedestal.
Figure 6:
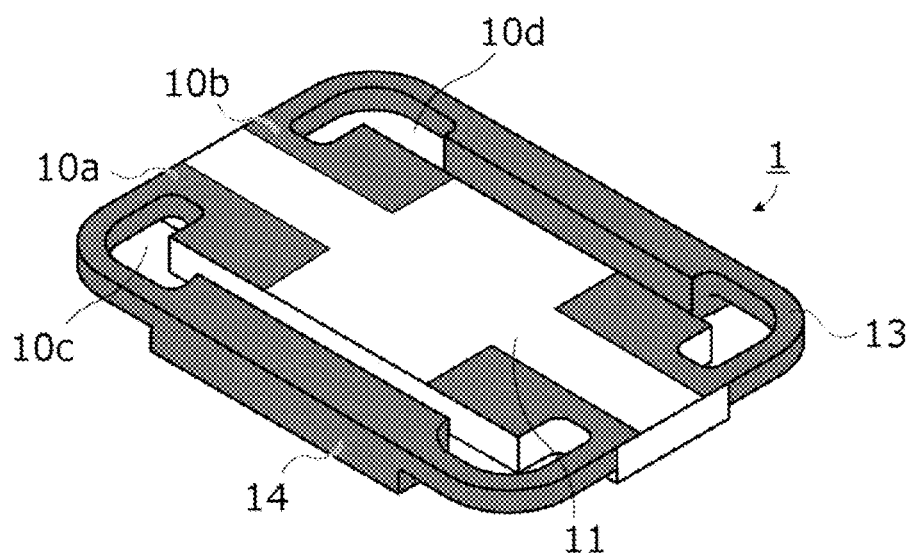
FIG. 6 is a perspective view illustrating the front surface of this pedestal.
Figure 7:
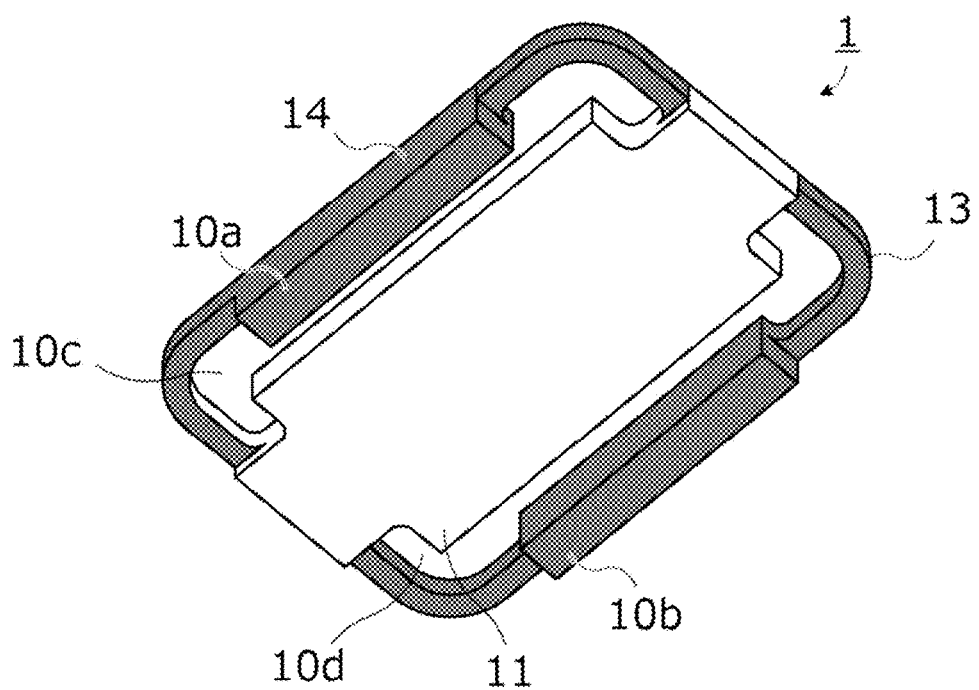
FIG. 7 is a perspective view illustrating the back surface of this pedestal.

Next, the following describes the pedestal with reference to FIG. 2 to FIG. 7. FIG. 2 is an explanatory drawing illustrating a front surface of the pedestal. FIG. 3 is an explanatory drawing illustrating a long side surface of the pedestal. FIG. 4 is an explanatory drawing illustrating a short side surface of the pedestal. FIG. 5 is an explanatory drawing illustrating a back surface of the pedestal. FIG. 6 is a perspective view illustrating the front surface of the pedestal. FIG. 7 is a perspective view illustrating the back surface of the pedestal.

As illustrated in FIG. 2, the pedestal 1 includes: clearance portions 10c and 10d, a central mounting portion 11, arm portions 13, and connection portions 14. The clearance portions 10c and 10d are internally formed along two long sides of a main body. The mounting portion 11 is located between the clearance portions 10c and 10d, and the crystal element 2 is mounted to the mounting portion 11. The arm portion 13 is curved in a circular arc shape on four corner portions of the main body. The connection portion 14 is disposed on a long side of the mounting portion 11 and is connected to the electrode formed on the base plate (bottom surface) of the package 3.

The arm portion 13 is curved to have a structure like an arm, and thus is referred to as an arm portion.

That is, the pedestal 1 has a configuration where the arm portions 13 and the connection portions 14 are formed so as to surround the mounting portion 11 having an approximately rectangular shape, and the arm portion 13 connects the mounting portion 11 to the connection portion 14.

The two U-shaped clearance portions 10c and 10d are formed along the long sides of the mounting portion 11. These clearance portions 10c and 10d pass through a front and back of the pedestal 1.

Here, the mounting portion 11 has a short side having a width (length in a longitudinal direction in FIG. 2) narrower than a width at its center. This constructs the clearance portions 10c and 10d in U shapes opened upward and downward. Such a configuration provides a larger flexibility (elasticity).

The connection portion 14 projects toward a lower side (base plate side) of the package 3 compared with other components. That is, only the connection portion 14 contacts the base plate of the package 3.

As illustrated in FIG. 2 and FIG. 5 to FIG. 7, the connection portion 14 has a width wider than a width of the arm portion 13. While this ensures the increased bonding area with the base plate of the package 3, the narrow width of the arm portion 13 causes the arm portion 13 to bend to have a flexibility.

As illustrated in FIG. 2, the pedestal 1 has a front surface on which electrode patterns 10a and 10b are formed. The electrode patterns 10a and 10b are formed of a thin film made of a metal such as gold.

Specifically, square-shaped patterns, where a conductive adhesive is applied, are formed on parts overlapping the crystal element 2, and the patterns are formed up to the connection portions 14 via the arm portions 13 located near the square-shaped patterns.

In FIG. 2, the electrode patterns 10a and 10b are formed excluding the central parts of long sides and short sides of the mounting portion 11, so as to surround the clearance portions 10c and 10d. As a result, the electrode patterns 10a and 10b ensures coating the metal film to enhance strength of the arm portion 13.

Further, as illustrated in FIG. 3, FIG. 4, FIG. 6, and FIG. 7, the electrode patterns 10a and 10b are also formed on a side surface of the arm portion 13 and a side surface of the connection portion 14.

Furthermore, as illustrated in FIG. 5 and FIG. 7, the electrode patterns 10a and 10b are also formed on a back side of the arm portion 13 and the connection portion 14 on a back surface of the pedestal 1.

The conductive adhesives are provided adjacent to the four corners of the crystal element 2 to secure the crystal element 2.

Specifically, while the crystal element 2 is secured to the pattern at four rectangular parts of the electrode patterns 10a and 10b formed on the mounting portion 11 with the conductive adhesive, the excitation electrode on the front side of the crystal element 2 is connected to the conductive adhesive at one of the four rectangular parts, and the excitation electrode on the back side of the crystal element 2 is connected to the conductive adhesive at the other one of the four rectangular parts.

Assuming that the mounting portion 11 part has a thickness a, and the arm portion 13 has a thickness b, a relationship of a>b is satisfied. Further, the connection portion 14 has a thickness c, providing a relationship of c>a>b.

That is, the thickness c of the connection portion 14, which contacts the base plate of the package 3, is the thickest while the thickness b is the thinnest.

This provides a configuration where only a bottom surface of the connection portion 14 is connected to the base plate of the package 3 by forming the thickness of the connection portion 14 thickest, thus disposing the arm portion 13 and the mounting portion 11 apart above the base plate.

Thus, in the configuration, even when a vibration is applied to the connection portion 14 from outside, the arm portion 13 can absorb and reduce the vibration. Therefore, the vibration generated in the base plate does not influence to the crystal element 2 mounted to the mounting portion 11.

The arm portion 13 having the thinnest thickness provides a configuration where the arm portion 13 has a flexibility against a stress to easily absorb the vibration influence. Further, the mounting portion 11 has the thickness thicker than the thickness of the arm portion 13 to enhance a rigidity, thus ensuring prevention of the deformation of the mounting portion 11 itself due to the stress from the plurality of arm portions 13. This reduces the generation of the stress between the mounting portion 11 and the crystal element 2 to ensure the improved vibration resistance and impact resistance.

The part where the arm portion 13 is connected to the mounting portion 11 and the part where the arm portion 13 is connected to the connection portion 14 are weak against an impact from outside to be easily damaged. The pedestal 1 includes the electrode patterns 10a and 10b formed so as to cover those connection parts, and thus prevents the damage of those connection parts.

Figure 8:
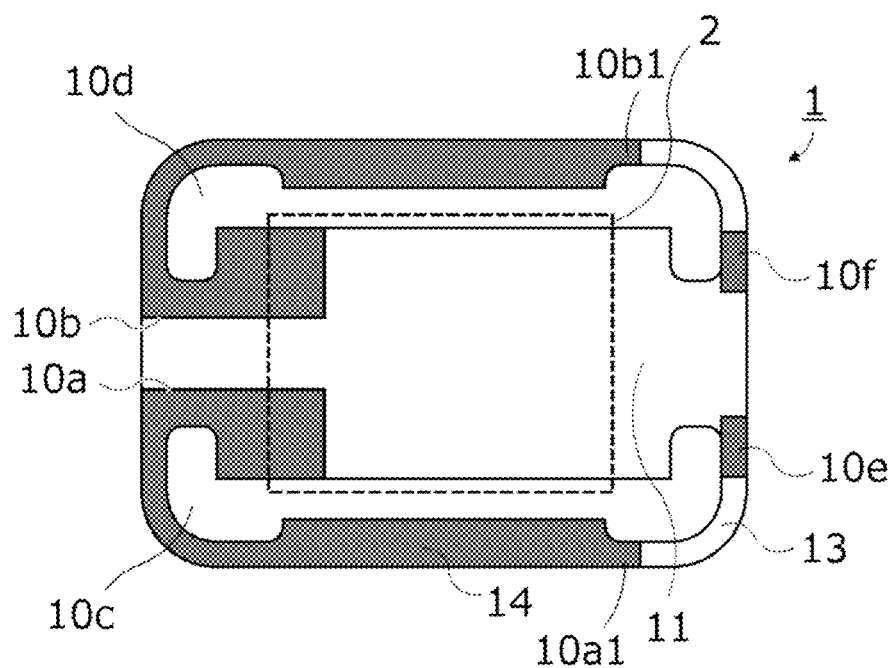
FIG. 8 is an explanatory drawing illustrating a front surface of another pedestal.
Figure 9:
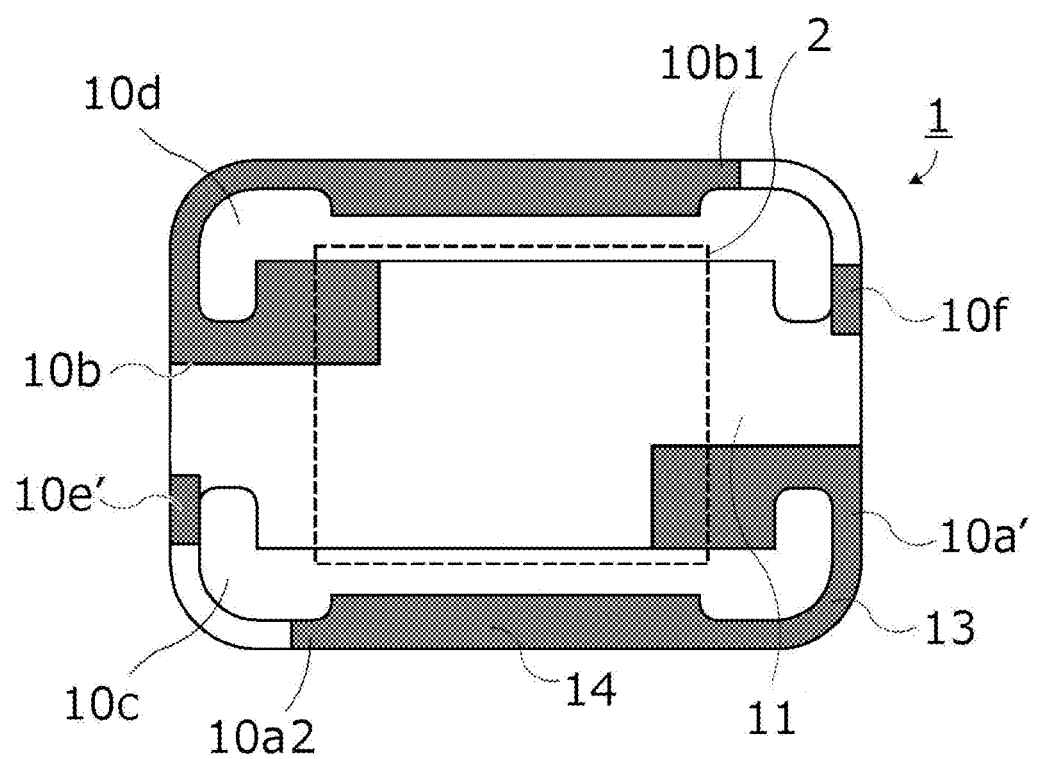
FIG. 9 is an explanatory drawing illustrating the front surface of the other pedestal.

Another Pedestal in FIG. 8 and FIG. 9

Next, the following describes another pedestal (the other pedestal) according to the embodiment of the disclosure with reference to FIG. 8 and FIG. 9. FIG. 8 and FIG. 9 are explanatory drawings illustrating a front surface of the other pedestal. FIG. 8 and FIG. 9 have a difference in directions where the electrode patterns 10a and 10b are extracted.

In FIG. 8, the electrode pattern 10a is extracted from the rectangular-shaped metal pattern formed on a lower left side of the mounting portion 11 to a short side on a left side of the main body. The metal pattern is formed up to the lower left arm portion 13 and the lower side connection portion 14. Further, a metal pattern 10a1 is formed up to a part of the other (lower right) arm portion 13 connected to this connection portion 14.

The metal pattern 10a1 is formed on the connection part (base part) of the connection portion 14 and the other arm portion 13. When an impact due to, for example, dropping is caused from outside, a force concentrates on this part to easily damage the part. Covering (coating) this easily damaged part with the metal pattern 10a1 reinforces the arm portion 13. The metal pattern 10a1 is also formed on a front surface, a back surface, and a side surface of a part of the arm portion 13.

In FIG. 8, the electrode pattern 10b is extracted from the rectangular-shaped metal pattern formed on an upper left side of the mounting portion 11 to a short side on the left side of the main body. The metal pattern is formed up to the upper left arm portion 13 and the upper side connection portion 14. Further, a metal pattern 10b1 is formed up to a part of the other (upper right) arm portion 13 connected to this connection portion 14.

The metal pattern 10b1 is formed on the connection part of the connection portion 14 and the other arm portion 13. Covering (coating) this easily damaged part with the metal pattern 10b1 reinforces the arm portion 13. The metal pattern 10b1 is also formed on the front surface, the back surface, and the side surface of a part of the arm portion 13.

Further, a dummy metal pattern 10e is formed on the connection part of the lower right arm portion 13 and a right side short side of the mounting portion 11.

Similarly, a dummy metal pattern 10f is formed on the connection part of the upper right arm portion 13 and the right side short side of the mounting portion 11.

The dummy metal patterns 10e and 10f also include metal films formed on the front surface, the back surface, and the side surface of the arm portion 13.

While in FIG. 9, the electrode pattern 10b, the metal pattern 10b1, and the dummy metal pattern 10f are similar to those of FIG. 8, an electrode pattern 10a' is extracted from the rectangular-shaped metal pattern formed on a lower right side of the mounting portion 11 to a short side on a right side of the main body. The electrode pattern 10a' is formed up to the lower right arm portion 13 and the lower side connection portion 14. Further, a metal pattern 10a2 is formed up to a part of the other (lower left) arm portion 13 connected to this connection portion 14.

Further, a dummy metal pattern 10e' is formed on the connection part of the lower left arm portion 13 and a left side short side of the mounting portion 11.

Shape of Arm Portion in FIG. 10A1 to FIG. 10D2

Next, the following describes a shape of the arm portion 13 of the pedestal 1 with reference to FIG. 10A1 to FIG. 10D2. FIG. 10A1 to FIG. 10D2 are schematic diagrams illustrating shapes of the arm portion.

First, while the shape of the arm portion 13 of the pedestal 1 is configured to have a uniform thickness, FIGS. 10A1 to 10D2 illustrates examples of the arm portion 13 that does not have a uniform thickness.

Here, four types of shapes of the arm portion 13 are illustrated. FIG. 10A1, FIG. 10B1, FIG. 10C1, and FIG. 10D1 each illustrate a part of the side surface on a side of the short side. FIG. 10A2, FIG. 10B2, FIG. 10C2, and FIG. 10D2 each illustrate a part of the side surface on a side of the long side.

FIG. 10A1 illustrates the arm portion 13 and the mounting portion 11 on the side of the short side of the pedestal. The arm portion 13 is configured to have two steps (multiple step shape) having a thick part 13b on a side close to the mounting portion 11 and a thin part 13a on the corner portion side.

FIG. 10A2 illustrates the arm portion 13 and the connection portion 14 on the side of the long side of the pedestal. The arm portion 13 is configured to have two steps having the thick part 13b on a side close to the connection portion 14 and the thin part 13a on the corner portion side.

In FIG. 10A1 and FIG. 10A2, a step portion is disposed on the back surface such that the front surfaces of the mounting portion 11, the arm portion 13, and the connection portion 14 are made flat.

As illustrated in FIG. 10B1 and FIG. 10B2, the arm portion 13 has the thickness with two steps.

The corner portion sides are the thin parts 13a, and the sides close to the mounting portion 11 and the connection portion 14 are thick parts 13c. The connection parts of the mounting portion 11 and the connection portion 14 to the thick parts 13c and the connection parts of the thin part 13a and the thick part 13c have steps on the front surface and the back surface.

As illustrated in FIG. 10C1 and FIG. 10C2, connection parts 13d of the arm portion 13 to the mounting portion 11 and the connection portion 14 have taper shapes (tapered shape).

Especially, the corner portion sides are the thin parts 13a, and the connection parts 13d have the taper shapes gradually increasing in thickness toward the mounting portion 11 and the connection portion 14 on the back surface.

As illustrated in FIG. 10D1 and FIG. 10D2, connection parts 13e of the arm portion 13 to the mounting portion 11 and the connection portion 14 have taper shapes.

Especially, the corner portion sides are the thin parts 13a, and the connection parts 13e have the taper shapes gradually increasing in thickness toward the mounting portion 11 and the connection portion 14 on the front surface and the back surface.

What is common in FIG. 10A1 to FIG. 10D2 is: the curve-shaped thin part 13a of the arm portion 13 on the corner portion of its main body is configured to have a thin structure to have a flexibility; and the parts (base parts) 13b to 13e close to the mounting portion 11 and the connection portion 14 are configured to have a thick structure to have a strength.

Effect of Embodiment

The pedestal 1 is configured such that the electrode pattern on the back side of the connection portion 14 is secured to the electrode pattern formed on the base plate of the package 3 with the solder, and the arm portion 13 connects the mounting portion 11, which is surrounded by the clearance portions 10c and 10d, to the connection portion 14. The mounting portion 11 includes a cut-out portion where the short side is cut out to the center side, and the arm portion 13 extends up to the cut out short side of the mounting portion 11 and is connected to the mounting portion 11. Thus, the pedestal 1 provides the following effect. Even when a vibration is transmitted to the connection portion 14 from outside, the arm portion 13 in U shape or laid U shape can absorb the vibration to reduce the vibration transmission to the mounting portion 11, thus the pedestal 1 ensures the excellent phase noise characteristic and the improved impact resistance.

The disclosure is appropriate for a pedestal for vibration element, a resonator, and an oscillator. The pedestal reduces the vibration influence from outside to improve the vibration resistance, thus ensuring the excellent phase noise characteristic and the improved impact resistance.

According to the disclosure, in the above-described pedestal, the metal pattern may be connected to the connection portion via the arm portion closest to a part of the mounting portion connected to the electrode of the vibration element, and further the metal pattern is formed up to the mounting portion via another arm portion connected to the connection portion so as to surround the clearance portions.

According to the disclosure, in the above-described pedestal, the metal pattern may be connected to the connection portion via the arm portion closest to a part of the mounting portion connected to the electrode of the vibration element, and further the metal pattern is formed up to a part of the other arm portion connected to the connection portion.

According to the disclosure, in the above-described pedestal, the metal pattern may be formed up to the connection portion via the arm portion closest to a part of the mounting portion connected to the electrode of the vibration element, and another metal pattern is formed on a connection part of the other arm portion connected to the connection portion and the mounting portion connected to the other arm portion.

According to the disclosure, in the above-described pedestal, another metal pattern may be formed on a connection part of the other arm portion connected to the connection portion and the mounting portion connected to the other arm portion.

According to the disclosure, in the above-described pedestal, the metal pattern may be formed on front surfaces, side surfaces, and bottom surfaces of the arm portion and the connection portion.

According to the disclosure, in the above-described pedestal, the arm portion may have a shape curved in a circular arc shape.

According to the disclosure, in the above-described pedestal, the arm portions may be formed to be thinner at four corner parts of the main body compared with parts connecting to the mounting portion and the connection portion.

According to the disclosure, in the above-described pedestal, the arm portion may have the parts connecting to the mounting portion and the connection portion formed in a multiple step shape or a tapered shape.

According to the disclosure, a resonator may include a vibration element mounted to the above-described pedestal. The pedestal is installed to a base plate of a bottom surface of a depressed portion on a front surface of a package.

According to the disclosure, an oscillator may include a vibration element mounted to the above-described pedestal. The pedestal is installed to a base plate of a bottom surface of a depressed portion on a front surface of a package. An oscillator circuit is mounted to a depressed portion on a back surface of the package.

With the embodiment, in the pedestal, a main body includes two connection portions, two clearance portions, a mounting portion, and arm portions. The two connection portions are formed along long sides of the main body and contact the base plate. The two clearance portions are formed on insides of the main body with respect to the connection portions along the long sides. The mounting portion is located between the two clearance portions. The vibration element is mounted to the mounting portion. The arm portions are formed on four corners of the main body and connect the mounting portion to the connection portions. A metal pattern connected to an electrode formed on the vibration element is formed to connect the mounting portion, the arm portions, and the connection portions. Therefore, even when a vibration is transmitted to the connection portion from outside, the arm portion can absorb the vibration to prevent the vibration transmission to the mounting portion, thus the pedestal ensures the excellent phase noise characteristic and the improved impact resistance.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A pedestal for a vibration element, the vibration element being mounted to the pedestal, the pedestal being installed to a base plate of a package, and the pedestal comprising:
   a main body, including:
      two connection portions that are formed along long sides of the main body and contact the base plate,
      two clearance portions that are formed on insides of the main body with respect to the connection portions and formed along the long sides,
      a mounting portion located between the two clearance portions, the vibration element being mounted to the mounting portion, and
      arm portions that are formed on four corners of the main body and connect the mounting portion to the connection portions; and
   a metal pattern, connected to an electrode formed on the vibration element,
   wherein the metal pattern is formed to connect the mounting portion, the arm portions, and the connection portions.

2. The pedestal according to claim 1, wherein
the metal pattern is connected to the connection portion via the arm portion closest to a part of the mounting portion connected to the electrode of the vibration element, and
further the metal pattern is formed up to the mounting portion via another arm portion connected to the connection portion so as to surround the clearance portions.

3. The pedestal according to claim 1, wherein
the metal pattern is connected to the connection portion via the arm portion closest to a part of the mounting portion connected to the electrode of the vibration element, and
further the metal pattern is formed up to a part of the other arm portion connected to the connection portion.

4. The pedestal according to claim 1, wherein
the metal pattern is formed up to the connection portion via the arm portion closest to a part of the mounting portion connected to the electrode of the vibration element, and
another metal pattern is formed on a connection part of the other arm portion connected to the connection portion and the mounting portion connected to the other arm portion.

5. The pedestal according to claim 3, wherein
another metal pattern is formed on a connection part of the other arm portion connected to the connection portion and the mounting portion connected to the other arm portion.

6. The pedestal according to claim 1, wherein
the metal pattern is formed on front surfaces, side surfaces, and bottom surfaces of the arm portion and the connection portion.

7. The pedestal according to claim 1, wherein
the arm portion has a shape curved in a circular arc shape.

8. The pedestal according to claim 1, wherein
the arm portions are formed to be thinner at four corner parts of the main body compared with parts connecting to the mounting portion and the connection portion.

9. The pedestal according to claim 8, wherein
the arm portion has the parts connecting to the mounting portion and the connection portion formed in a multiple step shape or a tapered shape.

10. A resonator, comprising:
a vibration element, mounted to the pedestal according to claim 1,
wherein
the pedestal is installed to a base plate of a bottom surface of a depressed portion on a front surface of a package.

11. An oscillator, comprising:
a vibration element, mounted to the pedestal according to claim 1,
wherein
the pedestal is installed to a base plate of a bottom surface of a depressed portion on a front surface of a package, and
an oscillator circuit is mounted to a depressed portion on a back surface of the package.

* * * * *